United States Patent [19]
Belt et al.

[11] Patent Number: 5,311,532
[45] Date of Patent: May 10, 1994

[54] CALCIUM-YTTRIUM SILICATE OXYAPATITE LASERS

[75] Inventors: Roger F. Belt, Morristown, N.J.; Mark Randles, Monroe, N.C.

[73] Assignee: Litton Systems, Inc., Morris Plains, N.J.

[21] Appl. No.: 51,885

[22] Filed: Apr. 26, 1993

[51] Int. Cl.$^5$ .............................. H01S 3/16
[52] U.S. Cl. .............................. 372/41; 372/39; 252/301.4 F
[58] Field of Search ................. 372/39, 41; 252/301.4 F

[56] References Cited

U.S. PATENT DOCUMENTS

| | | | |
|---|---|---|---|
| 3,569,221 | 4/1972 | Melamed et al. | 372/41 |
| 3,686,586 | 8/1972 | Roland et al. | 372/41 |
| 3,710,278 | 1/1973 | Hopkins et al. | 372/41 |
| 3,828,276 | 8/1974 | Cohen | 372/98 |

Primary Examiner—Léon Scott, Jr.
Attorney, Agent, or Firm—Michael H. Wallach

[57] ABSTRACT

A calcium yttrium silicate oxyapatite laser crystal doped with thulium provides a laser material finding particular utility in 2 $\mu$m diode pumped lasers. The calcium yttrium silicate oxyapatite doped with trivalent thulium, preferably has the formula $$Ca(Tm_x Y_{1-x})_4(SiO_4)_3O, \text{ where } x = 0.0025 - 0.12.$$

10 Claims, 2 Drawing Sheets

CALCIUM-YTTRIUM SILICATE OXYAPATITE LASERS

This invention was made with Government support under Contract No. N00014-90-C-0233 by the Office of Naval Research of the Department of the Navy. The Government has certain rights in this invention.

BACKGROUND OF THE INVENTION

1. Field of the Invention

The present invention relates to calcium-yttrium silicate oxyapatite lasers.

2. Description of the Prior Art

Calcium-yttrium silicate oxyapatite lasers are described in U.S. Pat. Nos. 3,710,707 and 3,781,707. Fluorapatite laser material doped with chromium and holmium or thulium is described in U.S. Pat. No. 3,627,692.

SUMMARY OF THE INVENTION

In accordance with the present invention a calcium yttrium silicate oxyapatite laser crystal is doped with thulium to produce a laser material finding particular utility in 2 μm diode pumped lasers.

In its broadest aspect, the present invention relates to a single crystal of calcium yttrium silicate oxyapatite doped with trivalent thulium, preferably having the formula

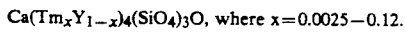

$Ca(Tm_xY_{1-x})_4(SiO_4)_3O$, where $x = 0.0025 - 0.12$.

It has been discovered that in a single crystal of calcium yttrium silicate oxyapatite ($CaY_4(SiO_4)_3O$) or "CaYSOAP" doped with trivalent thulium $Tm^{3+}$, the thulium ion exhibits an unusually high absorption coefficient (for example, 34 cm$^{-1}$ at 6% Tm dopin x=0.06) at 790 nm compared to other oxide host crystals such as Tm doped YAG.

The trivalent thulium doped CaYSOAP can be used as laser material and finds particular utility as laser material for compact diode pumped lasers with 2 μm output. Due to the high absorption coefficient the thulium concentration can be decreased which reduces ground state absorption, improves efficiency of 2 μm laser and increases wavelength tunability. Use of laser crystals composed of the trivalent thulium doped CaYSOAP material of the present invention allows single mode operation which is made possible by high absorption coefficient of the material.

Use of the trivalent thulium doped CaYSOAP material of the present invention results in improved operation of 2.3 μm thulium laser.

The trivalent thulium doped material of the present invention can be used to produce polarized output at 2 or 2.3 μm.

DESCRIPTION OF THE PREFERRED EMBODIMENTS

The silicate oxyapatite host material of this invention has the formula $CaY_4(SiO_4)_3O$. This host contains ion sites which will accommodate trivalent thulium dopant to form a laser material which can suitably be used in a typical laser generator.

Figure 1:
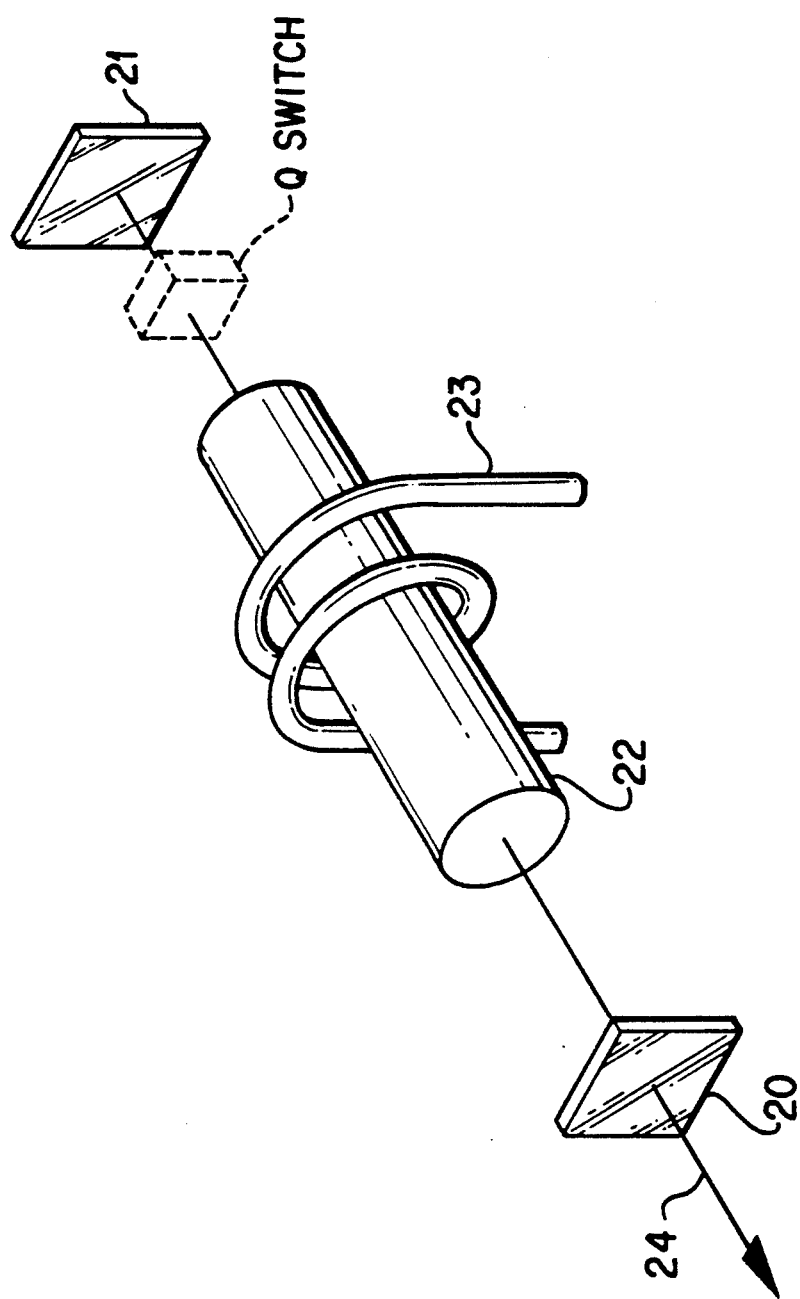
FIG. 1 shows a laser generator utilizing the laser crystal of this invention in association with a radiation source in a resonant laser cavity.

A simple schematic illustration of a typical laser generator is shown in FIG. 1 of the drawings. Between reflectors 20 and 21 there is a resonant laser cavity containing the laser crystal 22, a radiation source means 23 such as a flash lamp which provides pump energy to the crystal, and possibly a Q switching means shown by dotted lines. Reflector 20 is partially reflecting to permit the escape of light beams of coherent radiation 24 whereas reflector 21 is highly reflective.

The basic principle involved in Q switching a laser is to allow a very high population inversion to be built up by making the laser cavity losses excessive while the laser is being pumped, thereby preventing the laser from oscillating prematurely. When a strong inversion is attained, the conditions are suddenly made favorable for oscillation by rapidly making the cavity losses very small, so that a condition of large net amplification is suddenly realized. The Q switch could, for example, contain a metallo-organic compound in solution such as a phthalocyanine which absorbs light from the crystal. The pumping energy input from the flash lamp increases until amplification in the laser crystal overcomes the loss due to absorption in the Q switch cell and the laser begins to emit coherent light weakly. A very small amount of this light bleaches the solution which then becomes almost perfectly transparent to the light. At that instant there is suddenly a giant pulse of light containing all the stored energy in the laser rod.

Figure 2:
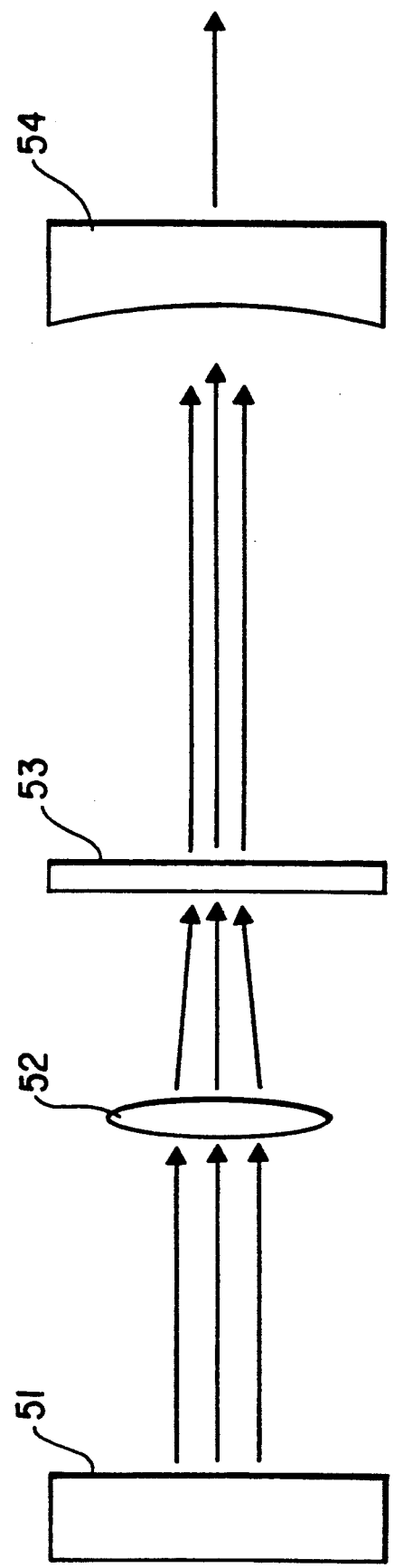
FIG. 2 shows a diode pumped laser generator utilizing the laser crystal of this invention in association with a radiation source in a resonant laser cavity.

A diode pumped laser is shown schematically in FIG. 2 of the drawings where 51 represents a laser diode or diode array and 52 represents a focus lens. The laser crystal 53 suitably is a 6%Tm:CaYSOAP 3 mm diameter wafer of length (thickness) 570 μm. The output coupler 54 has a 5 cm radius of curvature.

Monocrystals of CaYSOAP ($CaY_4(SiO_4)_3O$) are grown by the Czochralski process. Raw materials of greater than 99.99% purity are melted in an iridium crucible which is induction heated with 10 KHz radio frequency power. The crucible is surrounded by ceramic insulation comprised of various materials such as zirconia, alumina and fused silica. The furnace insulation package determines the thermal gradients which stabilize the growth and affect crystal quality. The furnace is contained within a metal chamber which allows for control of the growth atmosphere. For typical oxide growth the atmosphere is 0% to 3% oxygen in a carrier gas of nitrogen or argon. Growth initiates on a seed crystal introduced through the top of the growth chamber and contacted with the melt surface. At the proper temperature the seed is slowly raised or "pulled" and new material crystallizes on the bottom of the seed. Seed rotation aids melt mixing and homogenizes radial thermal gradients. The crystal diameter is controlled by weighing the crystal and making slight adjustments to the RF power, usually with the aid of an automatic controller or computer. The diameter is programmed from seed diameter to full diameter then held there until the desired crystal length is obtained. Growth terminates by freezing the crystal into the melt or by raising the crystal quickly to clear the melt surface. Long cool down times of 10 to 30 hours avoid thermal shock and cracking.

The melt composition for CaYSOAP, produced in accordance with the above-discussed method, is assumed stoichiometric. Variations of a few percent generally do not seriously affect crystal growth. The thulium ion $Tm^{3+}$ replaces yttrium $Y^{3+}$ in the melt formula which then has the composition:

$$Ca(Tm_xY_{1-x})_4(SiO_4)_3O$$

For a 3 inch diameter by 3 inch high iridium crucible the total melt weight was 1400 grams. For 6 atomic % Tm doping (x=0.06) the melt was prepared from the following raw materials:

| | |
|---|---|
| $CaCO_3$ | 198.15 g |
| $Tm_2O_3$ | 91.67 |
| $Y_2O_3$ | 840.45 |
| $SiO_2$ | 356.89 |
| TOTAL WEIGHT | 1487.16 |

The melting temperature of CaYSOAP is approximately 2050° C., and as the powders heat above about 825° C. the $CaCO_3$ decomposes and loses $CO_2$ resulting in a 1400 gram net melt weight.

The crystal obtained from the 6%Tm:CaYSOAP melt was 1 inch diameter by 3 inches long and represented 8% of the melt weight. The growth run employed a pull rate of 1 mm/hour and a rotation rate of 10 rpm. The crystal interface was convex, extending into the melt about 0.5 inch. By x-ray orientation the growth axis was determined to be 10° off the c-axis of the hexagonal structure. SOAP crystals grow equally well on the a-axis.

Crystals of CaYSOAP show a fine scattering of light due to small second phase precipitates. The scatter can be significantly reduced by annealing in air at 1400°-1500° C. for 100 hours. No attempt was made to optimize annealing conditions.

The 6% Tm:CaYSOAP crystal was x-ray oriented to the c-axis and cut with a diamond saw to yield top and bottom slices. These 1.5 mm thick slices were polished and measured with a spectrophotometer for the magnitude of the thulium absorption peaks. The peak absorption coefficients for the top and bottom slices were the same, meaning that the thulium concentration was the same. The thulium distribution coefficient is near unity which is as expected since $Tm^{3+}$ and $Y^{3+}$ have nearly the same ionic size. The melt and crystal have the same composition.

Spectroscopic cubes 5 mm on a side were also polished. Polarized absorption curves were taken for the E vector parallel to and perpendicular to the c-axis. 6% Tm:CaYSOAP has an unexpectedly high absorption at 790 nm for E parallel to c. The absorption coefficient is about 34 $cm^{-1}$ which is 6 times higher than 6% Tm in YAG (yttrium aluminum garnet). The width of the absorption peak at 790 nm is 3 nm which is twice that of 6% Tm:YAG. The wider peak relaxes somewhat the precise temperature control required to temperature tune the pump laser diode.

The 6% Tm:CaYSOAP was lased at 1.94 μm on the $^3F_4 \rightarrow {}^3H_6$ transition. The upper state lifetime measured 0.59 ms and the stimulated emission cross-section is approximately $1 \times 10^{-20}$ $cm^2$. Pumping was accomplished with a titanium doped sapphire laser at 790 nm as a proxy for a laser diode. Due to the strong absorption coefficient the crystal thickness was only 570 μm.

The unexpectedly high absorption coefficient at 790 nm has several other advantages. First, the crystal can be fabricated very thin which improves the mode matching to the laser diode pump. Thin lasers can also operate with a single longitudinal mode. Second, the thulium concentration can be decreased which reduces detrimental ground state absorption in the two micron region and reduces upconversion losses. Reduced ground state absorption should also increase the tuning range of the two micron transition. Lower thulium concentrations should also increase the efficiency of the 2.3 micron transition from $^3H^4 \rightarrow {}^3H_5$.

A 1% Tm:CaYSOAP crystal was grown under the same conditions as the 6% Tm:CaYSOAP. Spectroscopic analysis showed a 790 nm absorption coefficient of 6 $cm^{-1}$ and a lifetime of the $^3F^4$ upper laser level of 1.2 ms. The absorption scales with Tm concentration as expected.

The foregoing detailed description set forth is the preferred embodiment of the method of the present invention. However, certain changes may be made in carrying out the above method without departing from the scope of the invention; it is therefore intended that all matter contained in the above description shall be interpreted as illustrative and not in a limited sense. It is also to be understood that the following claims are intended to cover all of the generic and specific features of the invention herein described, and all statements of the scope of the invention which, as a matter of language, might be said to fall therebetween.

We claim:

1. A single crystal of calcium yttrium silicate oxyapatite doped with trivalent thulium.

2. The single crystal of claim 1 of the formula $$Ca(Tm_xY_{1-x})_4(SiO_4)_3O, \text{ where } x=0.0025-0.12.$$

3. In a laser comprising a single crystal incorporating a dopant and means for exciting atoms of the dopant to emit coherent radiation, the improvement which comprises utilizing, as the laser host, a single crystal of calcium yttrium silicate oxyapatite doped with trivalent thulium ions.

4. The laser of claim 3 wherein the single crystal of thulium doped calcium yttrium silicate oxyapatite has the formula $$Ca(Tm_xY_{1-x})_4(SiO_4)_3O, \text{ where } x=0.0025-0.12$$

5. The laser of claim 4 wherein the single crystal of thulium doped calcium yttrium silicate oxyapatite is crystallographically oriented substantially along the c axis.

6. The laser of claim 3 wherein the single crystal of thulium doped calcium yttrium silicate oxyapatite is crystallographically oriented substantially along the a axis.

7. In a 2 μm solid state laser, the improvement which comprises utilizing, as the laser host, a single crystal of calcium yttrium silicate oxyapatite doped with trivalent thulium ions.

8. The laser of claim 7 wherein the single crystal of thulium doped calcium yttrium silicate oxyapatite has the formula $$Ca(Tm_xY_{1-x})_4(SiO_4)_3O, \text{ where } x=0.0025-0.12.$$

9. The laser of claim 8 wherein the single crystal of thulium doped calcium yttrium silicate oxyapatite is crystallographically oriented substantially along the c axis.

10. The laser of claim 7 wherein the single crystal of thulium doped calcium yttrium silicate oxyapatite is crystallographically oriented substantially along the a axis.

* * * * *